(12) United States Patent
Yoon et al.

(10) Patent No.: US 9,290,859 B2
(45) Date of Patent: Mar. 22, 2016

(54) FILM FORMED BY SECONDARY GROWTH OF SEED CRYSTALS, THREE CRYSTAL AXES OF WHICH HAD ALL BEEN UNIFORMLY ORIENTED ON SUBSTRATE

(75) Inventors: Kyung Byung Yoon, Seoul (KR); CaoThanhTung Pham, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 419 days.

(21) Appl. No.: 13/821,813

(22) PCT Filed: Sep. 7, 2011

(86) PCT No.: PCT/KR2011/006629
§ 371 (c)(1),
(2), (4) Date: May 6, 2013

(87) PCT Pub. No.: WO2012/033347
PCT Pub. Date: Mar. 15, 2012

(65) Prior Publication Data
US 2013/0216772 A1    Aug. 22, 2013

(30) Foreign Application Priority Data

Sep. 8, 2010  (KR) .......................... 10-2010-0087935

(51) Int. Cl.
*C30B 19/12*     (2006.01)
*C30B 7/00*      (2006.01)
(Continued)

(52) U.S. Cl.
CPC ............ *C30B 19/12* (2013.01); *B01D 67/0051* (2013.01); *B01D 69/10* (2013.01);
(Continued)

(58) Field of Classification Search
CPC ............. B01D 67/0051; B01D 71/028; B01D 2323/24; C30B 7/005; C30B 19/12; C30B 29/60
USPC .................................................. 117/54, 63, 68
See application file for complete search history.

(56) References Cited

U.S. PATENT DOCUMENTS 7,811,547 B2   10/2010   Lee et al.
8,153,099 B2    4/2012   Yoon et al.
(Continued)

FOREIGN PATENT DOCUMENTS

JP      2004307296 A  *  11/2004  .............. C01B 39/04
KR  10-2005-0015373 A      2/2005
(Continued)

OTHER PUBLICATIONS

International Search Report issued in PCT/KR2011/0066429 mailed on Apr. 25, 2012 (6 pages).
(Continued)

*Primary Examiner* — Matthew Song
(74) *Attorney, Agent, or Firm* — Osha Liang LLP

(57) ABSTRACT

The present invention provides a method for preparing a thin or thick film, comprising the steps of: (1) arranging non-spherical seed crystals on a substrate such that all the a-, b- and c-axes of each seed crystal are oriented under a predetermined rule; and (2) forming and growing the film from the seed crystals through secondary growth by exposing the arranged seed crystals of step (1) to a seed crystal growth solution. The invention also provides a film prepared by the method. According to the invention, crystals or films larger than the seed crystals can be prepared.

15 Claims, 12 Drawing Sheets

(51) Int. Cl.

| | |
|---|---|
| *C30B 29/60* | (2006.01) |
| *C01B 39/00* | (2006.01) |
| *B01D 67/00* | (2006.01) |
| *B01D 69/10* | (2006.01) |
| *B01D 71/02* | (2006.01) |
| *C01B 37/02* | (2006.01) |
| *C01B 39/38* | (2006.01) |
| *C01B 39/40* | (2006.01) |

(52) U.S. Cl.
CPC ............ *B01D 71/028* (2013.01); *C01B 37/02* (2013.01); *C01B 39/00* (2013.01); *C01B 39/38* (2013.01); *C01B 39/40* (2013.01); *C30B 7/005* (2013.01); *C30B 29/60* (2013.01); *B01D 2323/24* (2013.01); *Y10T 428/24273* (2015.01); *Y10T 428/24744* (2015.01)

(56) References Cited

U.S. PATENT DOCUMENTS

| | | | |
|---|---|---|---|
| 8,288,302 B2 | 10/2012 | Yoon et al. | |
| 2001/0020416 A1* | 9/2001 | Yoshikawa | H01G 9/12 95/45 |
| 2002/0183407 A1* | 12/2002 | Yoon | B01D 53/94 521/50 |
| 2005/0014371 A1 | 1/2005 | Tsapatsis et al. | |
| 2008/0160190 A1 | 7/2008 | Takeuchi et al. | |
| 2008/0217240 A1* | 9/2008 | Yabuki | B01D 61/362 210/500.25 |
| 2009/0246122 A1 | 10/2009 | Yoon et al. | |
| 2009/0291046 A1* | 11/2009 | Yoon | B01D 67/0051 423/707 |
| 2012/0100364 A1 | 4/2012 | Yoon et al. | |
| 2012/0114920 A1 | 5/2012 | Yoon et al. | |

FOREIGN PATENT DOCUMENTS

| | | | |
|---|---|---|---|
| KR | 10-0789661 B1 | 12/2007 | |
| KR | 10-2009-0120846 A | 11/2009 | |
| WO | 2004080889 A2 | 9/2004 | |
| WO | WO 2004080889 A2 * | 9/2004 | ......... B01D 67/0051 |
| WO | 2005012177 A1 | 2/2005 | |
| WO | 2009142408 A2 | 11/2009 | |
| WO | 2010/117228 A2 | 10/2010 | |
| WO | 2010/117229 A2 | 10/2010 | |

OTHER PUBLICATIONS

Written Opinion of the International Searching Authority issued in PCT/KR2011/006629 mailed on Apr. 25, 2012 (6 pages).
Supplemental European Search Report issued in corresponding European Application No. 11823780 dated Sep. 29, 2014 (3 pages).
Takayuki Ban et al., Silicate Aqueous Solutions Including Amines as a Base, Journal of Porous Materials, vol. 12, No. 4, pp. 255-263, Oct. 1, 2005 (9 pages).
Godwin T. P. Mabande et al., Preparation of b-Oriented MFI Films on Porous Stainless Steel Substrates, Industrial & Engineering Chemistry, vol. 44, No. 24, pp. 9086-9095, Nov. 1, 2005 (10 pages).
Inho Lee et al., m-Tiles and mortar approach: A simple technique for the facile fabrication of continuous b-oriented MFI silicalite-1 thin films, Microporous and Mesoporous Materials, vol. 122, No. 1-3, pp. 288-293, Jun. 1, 2009 (6 pages).

* cited by examiner

Anisotropic, Coffin shape Silicalite-1 crystal

Anisotropic, Leaf shape Silicalite-1 crystal c-axis assembly

FILM FORMED BY SECONDARY GROWTH OF SEED CRYSTALS, THREE CRYSTAL AXES OF WHICH HAD ALL BEEN UNIFORMLY ORIENTED ON SUBSTRATE

TECHNICAL FIELD

The present invention relates to a film formed by secondary growth of seed crystals, three crystal axes of which all are oriented on a substrate, and to a method for preparing the same.

BACKGROUND ART

Zeolite refers to a generic term for a group of crystalline aluminosilicate. Because sites around aluminum in the framework of aluminosilicate bear negative charges, cations for charge balance are present in the pores, and the remaining space of the pores is usually filled with water molecules. The three-dimensional pore structure, shape and size of zeolite vary depending upon the type of zeolite, but the pore diameter usually corresponds to the molecular scale. Therefore, zeolite is also called "molecular sieve", because it has size selectivity or shape selectivity for molecules entering the pores depending on the type of zeolite.

On the other hand, many zeotype molecular sieves are known in which silicon (Si) and aluminum (Al) atoms constituting the framework structure of zeolite are partially or wholly replaced by various other elements. Examples of known zeotype molecular sieves include porous silicalite-based molecular sieves free of aluminum, $AlPO_4$-based molecular sieves in which silicon is replaced by phosphorus (P), and other zeotype molecular sieves obtained by substituting a portion of the framework of such zeolite and zeotype molecular sieves with various metal atoms such as Ti, Mn, Co, Fe and Zn. These zeotype molecular sieves are materials derived from zeolites, and do not belong to the zeolite group based on the mineralogical classification but are commonly called as zeolites in the art.

Accordingly, the term "zeolite" as used herein is intended to include the above-mentioned zeotype molecular sieves in a broad sense.

Zeolites with an MFI structure are most actively used and include the following types:

1) ZSM-5: MFI zeolite in which silicon and aluminum are present in a specific ratio;
2) Silicalite-1: zeolite composed only of silica; and
3) TS-1: MFI zeolite in which aluminum atoms are partially replaced by titanium (Ti) atoms.

The structure of an MFI zeolite is depicted in FIG. 1. In the MFI zeolite, elliptical pores (0.51 nm×0.55 nm) are connected in a zigzag configuration to form channels extending in the a-axis direction, and substantially circular pores (0.54 nm×0.56 nm) linearly extend in the b-axis direction to form straight channels. No channels remain open in the c-axis direction.

Powdered MFI zeolites are very widely used in household and industrial applications, including petroleum cracking catalysts, adsorbents, dehydrating agents, ion exchangers, gas purifiers, etc. MFI zeolite thin films formed on porous substrates, such as porous alumina, are widely used as membranes through which molecules can be separated on the basis of size. Furthermore, MFI zeolite thin films can find application in a wide range of fields, for example, second- and third-order nonlinear optical thin films, three-dimensional memory materials, solar energy storage devices, electrode auxiliary materials, carriers of semiconductor quantum dots and quantum wires, molecular circuits, photosensitive devices, luminescent materials, low dielectric constant (k) thin films, anti-rusting coatings, etc.

As described above, the pore shape, size and channel structure of MFI zeolites vary depending on the crystal direction.

Meanwhile, methods for producing MFI zeolite thin films on substrates such as glass plates are broadly divided into a primary growth method and a secondary growth method. According to the primary growth method, a substrate is dipped in a gel for the synthesis of MFI zeolite without any pretreatment, and then spontaneous growth of an MFI zeolite film on the substrate is induced. Generally, the gel for synthesis contains tetrapropylammonium hydroxide (TPAOH). In this case, b-axis-oriented MFI zeolite crystals grow perpendicular to the substrate at the initial stage of the reaction. At this time, a-axis oriented crystals begin to grow parasitically from central portions of most of the crystals grown on the glass plate. With the passage of time, the crystals grow in various directions, and as a result, the final thin film has various orientations. The randomly oriented MFI zeolite thin film is useful in some applications, but its applicability is limited. Particularly, when the randomly oriented MFI zeolite thin film is applied as a membrane for the separation of molecules, the molecular permeability, which is one of the most important factors in the molecular separation, is markedly reduced. When organic bases other than TPAOH are used in the primary growth method, no MFI zeolite thin film grows on the substrate. The secondary growth method is an alternative way to overcome the drawbacks of the primary growth method.

According to the secondary growth method, a substrate, to which MFI zeolite crystals are previously attached, is dipped in an MFI zeolite synthesis gel, and then the reaction is allowed to proceed to form an MFI zeolite thin film. The MFI zeolite crystals attached to the substrate act as seeds. The orientation of the MFI zeolite crystals, previously attached on the substrate, plays a very important role in determining the orientation of the MFI zeolite thin film to be produced later. For example, when the a-axes of the MFI zeolite seed crystals are oriented perpendicular to the substrate, the a-axes of the MFI zeolite thin film, formed from the oriented seed crystals, tend to be oriented perpendicular to the substrate, and when the b-axes of the MFI zeolite seed crystals are oriented perpendicular to the substrate, the b-axes of the MFI zeolite thin film, formed from the oriented seed crystals, tend to be oriented perpendicular to the substrate.

However, the orientation of the resulting zeolite thin film is highly sensitive to an organic base contained in the synthesis gel rather than to the orientation of the seed crystals. For example, the MFI synthesis gel which has been used in the secondary growth method usually contains TPAOH. In this case, even when the MFI zeolite seed crystals are attached to the substrate such that the a- or b-axes are oriented perpendicular to the substrate, the orientation of the resulting MFI zeolite thin film varies randomly.

Throughout the specification, a number of publications and patent documents are referred to and cited. The disclosure of the cited publications and patent documents is incorporated herein by reference in its entirety to more clearly describe the state of the related art and the present disclosure.

DISCLOSURE

Technical Problem

As disclosed in Korean Patent Laid-Open Publication No. 2009-120846, the present inventors could form an MFI zeolite thin film, whose b-axes were all oriented perpendicular to the substrate to form straight channels perpendicular to the substrate surface, from MFI seed crystals whose b-axes were oriented perpendicular to the substrate surface. In this case, the a- and c-axes of the seed crystals and the formed thin film were oriented randomly (see FIG. 3).

As described in PCT/KR2010/002180 and PCT/KR2010/002181, the present inventors developed the technology capable of controlling all the orientations of the a-, b- and c-axes of crystals on a substrate.

Accordingly, the present inventors have found that seed crystals could be arranged on a substrate such that all the a-, b- and c-axes of each seed crystal had been oriented, and when the seed crystals, all the crystal axes of which have been three-dimensionally controlled, are subjected to secondary growth, the seed crystals are two-dimensionally connected to each other and/or grow perpendicular to the substrate surface in the substrate region in which the orientations of crystal axes of the adjacent seed crystals are uniform, to thereby form single crystals which are larger than the single seed crystals and whose crystal axes are uniformly oriented.

The present invention is based on this finding.

Technical Solution

The present invention provides a method for preparing a thin or thick film, comprising the steps of: (1) arranging non-spherical seed crystals on a substrate such that all the a-, b- and c-axes of each seed crystal are oriented under a predetermined rule; and (2) forming and growing the film from the seed crystals through secondary growth by exposing the arranged seed crystals of step (1) to a seed crystal growth solution.

The present invention also provides a film prepared by the above method.

Hereinafter, the present invention will be described in detail.

In the specification, the relationship between the a-, b- and c-axes of crystals is that the c-axis does not lie in a plane in which the a-axis and the b-axis lie. For example, the a-, b- and c-axes may be perpendicular to each other, or the c-axis may have an angle with respect to the plane in which the a-axis and the b-axis lie.

The present invention is characterized in that non-spherical seed crystals arranged on a substrate such that all the a-, b- and c-axes of each seed crystal have been oriented under a predetermined rule, is used as a template for secondary growth in a process of forming and growing a film from the seed crystals.

Herein, when the seed crystals are two-dimensionally connected to each other and/or grow perpendicular to the substrate surface in the substrate region in which the orientations of crystal axes of the adjacent seed crystals are uniform, single crystal film, which is larger than the single seed crystal and whose crystal axes are uniformly oriented, could be formed. Herein, the three-dimensional size of the seed crystals may be on the order of $nm^3$ to $um^3$ scale, and the two-dimensional size of the film formed therefrom may be on the order of $mm^2$ to $cm^2$ (up to $10 \times 10\ cm^2$ in the Example). Also, because the thickness of the film can further be increased, the three-dimensional size of the grown single crystal film may be on the order of ~$cm^3$ scale.

Preferably, the formed film may be a single crystal film, the orientations of crystal axes of which are uniform throughout the film.

Step 1 of Arranging Seed Crystals on a Substrate Such that all the a-, b- and c-Axes of Each Seed Crystal are Oriented Under a Predetermined Rule Seed crystals that are used in the present invention are preferably the ordered porous materials.

In the present invention, the framework component of seed crystals and the film formed therefrom is not specifically limited.

Seed crystals and the film formed therefrom may be made of zeolite or zeotype molecular sieve. Also, seed crystals and the film formed therefrom may have an MFI structure.

As used herein, the term "zeolite" refers collectively to (i) minerals such as aluminum silicate hydroxides of alkali or alkaline earth metals, and includes as well (ii) zeotype molecular sieves obtained by replacing part or all of silicon (Si) and aluminum (Al) atoms of the framework of zeolites by various other elements, and also include all porous oxides and sulfides having surface hydroxyl groups in a broad sense.

Examples of MFI zeolites or zeotype molecular sieves include ZSM-5, silicalite, TS-I, AZ-I, Bor-C, boralite C, encilite, $FZ-I_5$ LZ-105, monoclinic H-ZSM-5, mutinaite, NU-4, NU-5, TSZ, TSZ-III, TZ-O1, USC-4, USI-108, ZBH and ZKQ-IB.

Other examples of seed crystals are disclosed in Korean Patent Laid-Open Publication No. 2009-120846 and U.S. Pat. No. 7,357,836.

Meanwhile, the non-spherical seed crystals that are used in the present invention may have the same or different shapes, as long as all the a-, b- and c-axes of each seed crystal are oriented under a predetermined rule on a substrate.

The substrate that is used in step (1) may be a porous or non-porous support. Preferred examples of substrates suitable for use in the present invention include:

1) oxides containing at least one metal or non-metal element selected from silicon (Si), aluminum (Al), titanium (Ti), fluorine (F), tin (Sn) and indium (In), and having a surface hydroxyl group, for example, quartz, mica, glass, conductive glass such as indium tin oxide (ITO)-deposited glass, tin oxide ($SnO_2$), F-doped tin oxide, silica, porous silica, alumina, porous alumina, titanium dioxide, porous titanium dioxide, and silicon wafers;

2) non-porous and porous non-metals, metals and metal alloys, which comprise one or more elements selected from among silicon (Si), aluminum (Al), titanium (Ti), iron (Fe), tin (Sn), gold (Au), silver (Ag), platinum (Pt) and stainless steel;

3) metals or alloys thereof, such as gold, silver, copper and platinum, which bind to a thiol (—SH) or amine (—$NH_2$) group;

4) polymers having various surface functional groups, for example, polyvinyl chloride (PVC) and Merrifield peptide resins;

5) semiconductors, such as zinc selenide (ZnSe), gallium arsenide (GaAs) and indium phosphide (InP);

6) natural and synthetic zeolites and porous zeotype molecular sieves; and 7) natural polymers, such as cellulose, starch (amylose and amylopectin) and lignin, synthetic polymers, and conductive polymers, which have surface hydroxyl groups or can be treated to have hydroxyl groups.

More preferred examples of substrates are various forms of oxides containing at least one metal or non-metal element, or porous or non-porous metals or alloys. Still more preferred are quartz, mica, glass, conductive glass (e.g., indium tin oxide (ITO) glass, tin oxide, F-doped tin oxide), and silica. Glass is most preferred.

In step (1), seed crystals arranged on the substrate such that all the a-, b- and c-axes of each seed crystals have been oriented under a predetermined rule, can be prepared according to the method described in PCT/KR2010/002180 and PCT/KR2010/002181 or a modification of the method.

Specifically, in step (1), seed crystals arranged on the substrate such that all the a-, b- and c-axes of each seed crystals have been oriented under a predetermined rule, can be prepared according to the following process:

Process 1 comprising the steps of:

(A) preparing a substrate, the surface of which has depressions or projections capable of fixing the position and orientation of seed crystal; and (B) placing seed crystals on the substrate, and then applying physical pressure to the seed crystals to insert a portion or the whole of each seed crystal into each of pores defined by the depressions or the projections.

Process 2 comprising the steps of:

(A) preparing a template, the surface of which has depressions or projections capable of fixing the position and orientation of seed crystal;

(B) placing seed crystals on the template, and then applying physical pressure to the seed crystals to insert a portion or the whole of each seed crystal into each of pores defined by the depressions or the projections thereby to arrange the seed crystals on the template; and (C) bringing the template having the seed crystals arranged thereon into contact with a substrate to transfer the seed crystals onto the substrate.

In the above process, the shape of the pore preferably corresponds to the shape of a portion or the whole of each seed crystal which is inserted into the pore in order to control the orientations of the seed crystals.

In the above process, the physical pressure may be applied by rubbing or pressing against the substrate or the template.

Meanwhile, the substrate or the template can form hydrogen bonds, ionic bonds, covalent bonds, coordination bonds or van der Waals bonds with the seed crystals by the physical pressure applied.

The depressions or projections present on the substrate or the template can be printed directly on the substrate, or formed using photoresist, or formed by laser ablation after coating with a sacrificial layer, or formed by inkjet printing.

Although photoresist or ink may be removed after arranging the seed crystals on the substrate, it may also be present as a support for the seed crystals during the secondary growth process. The seed crystals arranged on the substrate in step (1) may be in contact with or spaced apart from the adjacent seed crystals; however, photoresist or ink is required to have a sufficient thickness so as to act as a support for the seed crystals during the secondary growth process, and for this reason, the seed crystals are preferably spaced apart from each other.

Meanwhile, the seed crystals inserted into the pores on the substrate or the template can be gathered to form a specific pattern or shape, and the film formed therefrom can also form a specific pattern or shape (see FIG. 22).

In step (1), the seed crystals arranged on the substrate with all the a-, b- and c-axes thereof oriented uniformly, preferably form a monolayer.

Before step (1), a coupling agent capable of binding to the substrate or the template and the seed crystals may be applied to the substrate or template surface. As used herein, the term "coupling agent" refers to any compound having an end functional group, which enables coupling between the substrate or template and the seed crystals. Preferred coupling agents and the mechanisms of action and applications thereof are disclosed in Korean Patent Laid-Open Publication No. 2009-120846 and U.S. Pat. No. 7,357,836.

In step (1), the a-, b- and c-axes of the seed crystals can all be oriented on the substrate in such a manner that all the a-axes are parallel to each other, all the b-axes are parallel to each other and all the c-axes are parallel to each other. In addition, in step (1), the a-, b- or c-axis of the seed crystals may be oriented perpendicular to the substrate surface.

Step (2) of Forming and Growing the Film from the Seed Crystals Through Secondary Growth by Exposing the Seed Crystals Arranged on the Substrate to a Seed Crystal Growth Solution In step (2), the seed crystals are two-dimensionally connected to each other by second growth while they three-dimensionally grow perpendicular to the substrate surface by second growth, to thereby form a film.

In step (2), secondary growth from the surface of the seed crystals in a region in which orientations of the crystal axes of the adjacent crystal seeds are uniform, can form a single crystal larger than the largest diameter of the seed crystals parallel to the substrate surface through two-dimensional connection between the seed crystals. Alternatively, the secondary growth can form a single crystal larger than the largest diameter of the seed crystals perpendicular to the substrate surface through the growth of the seed crystals perpendicular to the substrate surface. Alternatively, the single crystal satisfying the above two conditions can be formed. For this purpose, in step (2), it is preferable that no crystal nucleation occurs in the crystal growth solution or on the seed crystal surface.

In the process in which the larger single crystals, the orientations of crystal axes of which are uniform, are formed from the seed crystals present in a specific region, the larger single crystals could be formed, as long as the orientations of crystal axes of the seed crystals in the region are uniform, even when some positions of the region lack the seed crystals.

Meanwhile, when the seed crystals are made of ordered porous materials that form channels in the crystals and the film formed in the region in which the adjacent seed crystals have a uniform orientation of the crystal axes, the channels of the seed crystals can extend within the film.

For example, in the film formed in the region in which the orientations of crystal axes of the adjacent seed crystals are uniform, channels extends continuously in an axial direction parallel to the substrate surface; or channels extends continuously in an axial direction perpendicular or oblique to the substrate surface; or the above two conditions can be satisfied.

A solvent in the seed crystal growth solution that is used in step (2) may be water or an organic solvent.

The seed crystal growth solution that is used in step (2) preferably contains a structure-directing agent.

The structure-directing agent serves as a template for crystalline structures, and the charge distribution, size and geometric shape of the structure-directing agent induce its structure-directing properties. The structure-directing agent that is used in step (2) of the method of the present invention is preferably a compound that induces only secondary growth from the surface of seed crystals without inducing crystal nucleation in the seed crystal growth solution or the seed crystal surface. As long as no crystal nucleation is induced, the growth rate of crystals along each crystal axis is not important.

The seed crystals that are used in step (1) may also be formed using a seed structure directing agent. Because the use of the seed structure directing agent induces crystal nucleation, it is not preferable to use the seed structure directing agent in step (2). Thus, the structure directing agent (SDA) in the seed crystal growth solution that is used in step (2) preferably differs from the seed structure directing agent.

When the seed crystals and the formed film are made of zeolite or zeotype molecular sieve, the structure-directing agent may be amine, imine or quaternary ammonium salt. Preferably, the structure-directing agent may be a quaternary ammonium salt represented by the following formula 1 or an oligomer having the salt as a repeating unit:

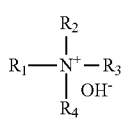

Formula 1 wherein $R_1$, $R_2$, $R_3$ and $R_4$ are each independently a hydrogen atom or a $C_1$-$C_{30}$ alkyl, aralkyl or aryl group which may contain at least one heteroatom selected from oxygen, nitrogen, sulfur, phosphorus and metal atoms. The number of the repeating units in the oligomer is 2-10, preferably 2-4. The structure-directing agent that is used in step (2) preferably excludes tetrapropyl ammonium hydroxide (TPAOH) and trimer tetrapropyl ammonium hydroxide (trimer TPAOH), which are used as structure-directing agents in the synthesis of zeolite seed crystals.

The term "$C_1$-$C_{30}$ alkyl" in formula 1 refers to a linear or branched saturated hydrocarbon group containing 1 to 30 carbon atoms, and examples thereof include methyl, ethyl, propyl, isobutyl, pentyl, hexyl, heptyl, octyl, nonyl, decyl, undecyl, tridecyl, pentadecyl and heptadecyl. Preferred is a $C_1$-$C_4$ linear or branched alkyl group.

The term "aralkyl" refers to an aryl group bonded to one or more alkyl groups, and is preferably benzyl.

The term "aryl" represents a wholly or partially unsaturated, substituted or unsubstituted monocyclic or polycyclic carbon ring, and is preferably monoaryl or biaryl. Preferably, the monoaryl has 5 or 6 carbon atoms, and the biaryl has 9 or 10 carbon atoms. Most preferably, the aryl is substituted or unsubstituted phenyl.

Meanwhile, when the seed crystals or the formed film is made of zeolite or zeotype molecular sieve, the seed crystal growth solution may comprise, in addition to the structure-directing agent, the following materials:

1) Aluminum (Al) materials, for example, organic-inorganic composite materials (e.g., aluminum isopropoxide) composed of aluminum and an organic material bonded to the aluminum, aluminum salts (e.g., aluminum sulfate), pure aluminum materials in the form of powder or lump, aluminum oxides (e.g., alumina), etc;

2) Silicon (Si) materials, for example, organic-inorganic composite materials (e.g., tetraethylorthosilicate (TEOS)) composed of silicon and an organic material bonded to the silicon, silicon salts (e.g., sodium silicalite), pure silicon materials in the form of powder or lump, glass powders, silicon oxides (e.g., quartz), etc;

3) Fluorine (F) materials, for example, all materials (HF, $NH_4F$, NaF and KF) containing F; and 4) Materials used to incorporate elements other than aluminum and silicon into the framework of zeolite.

In a preferred embodiment of the present invention, the seed crystal growth solution for zeolite or zeotype molecular sieve comprises a composition of $[TEOS]_x$ $[TEAOH]_y[(NH_4)_2SiF_6]_z[H_2O]_w$. The ratio of X:Y:Z:W in the composition is (0.1-30):(0.1-50):(0.01-50):(1-500), preferably (0.5-15):(0.5-25):(0.05-25):(25-400), more preferably (1.5-10):(1.0-15):(0.1-15):(40-200), and most preferably (3-6):(1.5-5):(0.2-5):(60-100).

In addition to the above composition, the seed crystal growth solution for zeolite or zeotype molecular sieve may further contain at least one element selected from transition metals such as titanium, Group 13 elements such as gallium, and Group 14 elements such as germanium, but is not limited thereto. The proportion of the additional component is limited to 0.1 to 30.

In the method of the present invention, the reaction temperature for film formation and growth may vary from 50 to 250° C., preferably from 80 to 200° C. and more preferably from 120 to 180° C., depending on the composition of the seed crystal growth solution or the material to be prepared. The reaction temperature is not always fixed and may vary stepwise.

In the method of the present invention, the reaction time for film formation and growth may vary from 0.5 hr to 20 days, preferably from 2 hr to 15 days, more preferably 6 hr to 2 days, and most preferably 10 hr to one day.

There is no restriction on the application of the film prepared according to the present invention. For example, the film can find application in molecular separation membranes, low dielectric constant materials in the semiconductor industry, nonlinear optical materials, membranes for water electrolysis, thin films for solar cells, optical materials and parts, interior and exterior components and parts for aircraft, cosmetic containers, household containers, mirrors, and other membranes utilizing the characteristics of nanopores of zeolite.

Advantageous Effects

According to the present invention, when the seed crystals arranged on a substrate such that all the a-, b- and c-axes of seed crystals are oriented uniformly, are subjected to secondary growth, the seed crystals are two-dimensionally connected to each other and/or grow perpendicular to the substrate surface in the substrate region in which the orientations of crystal axes of the adjacent seed crystals are uniform, to thereby form single crystals which are larger than the single seed crystals and the orientations of crystal axes of which is uniform.

In addition, according to the present invention, a film having channels formed in the directions perpendicular and parallel to the substrate surface can be formed. The film having nanochannels including various functional molecules, polymers, metal nanoparticles, or semiconductor quantum dots or quantum wires can be used as advanced materials for optical, electronic and photoelectronic applications. In particular, when films formed of porous alumina, porous silica or mesoporous materials have vertical channels, these films are highly useful as membranes for molecular separation.

DESCRIPTION OF THE REFERENCE NUMERALS IN THE DRAWINGS

100: substrate; and
A: a specific pattern or shape foamed by the collection of seed crystals inserted into pores on a substrate or a template.

MODE FOR INVENTION

Hereinafter, the present invention will be described in further detail with reference to examples. It is to be understood, however, that these examples are for illustrative purposes only and are not intended to limit the scope of the present invention.

Scanning Electron Microscope (SEM) Analysis

An about 15 nm thick platinum/palladium coating was formed on a produced thin film, and a SEM image of the thin film was obtained using a scanning electron microscope (Hitachi S-4300 FE-SEM).

X-Ray Diffraction (XRD) Analysis

To determine the crystal orientations of a thin film prepared according to the following example, X-ray power diffraction patterns were obtained by an X-ray diffractometer (Rigaku diffractometer D/MAX-1C, Rigaku) using CuKα X-rays.

EXAMPLE 1

Synthesis of Seed Crystals

Experimental Materials

TEAOH 35% (Alfa), TPAOH 1M (Sigma-Aldrich), $(NH_4)_2SiF_6$ 98% (Sigma-Aldrich), Tetraethylorthosilicate—TEOS 98% (Acros-Organic).

EXAMPLE 1-1

Anisotropic, Coffin-Shape Silicalite-1 Crystals 22.5 g of TEOS was added to a PP bottle containing 247.7 mL of DDW, 22.5 mL of TPAOH and 37.2 g of ethylene glycol (EG) to prepare a gel. The mixture was stirred for 24 hours to form a clear gel, and 6.168 mL of TEAOH was added thereto and was stirred for 12 hours. The obtained clear gel had a molar composition of 1 TEOS/0.15 TPAOH/0.1 TEAOH/4 EtOH/100 $H_2O$/4 EG. After aging, the gel was filtered through No. 2 Whatman filter paper and transferred into a Teflon-lined high-pressure reactor equipped with a clean stirring bar. The reactor was sealed, and the content in the reactor was heated by a jacket heater at 150° C. and stirred with a magnetic stirrer at 500 rpm. After hydrothermal reaction for 12 hours, the reaction product was cooled in tap water.

Figure 1:
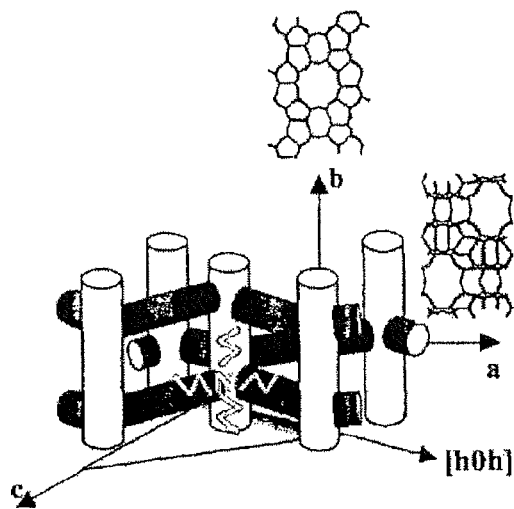
FIG. 1 schematically shows MFI crystals containing a structure-directing agent.
Figure 2:
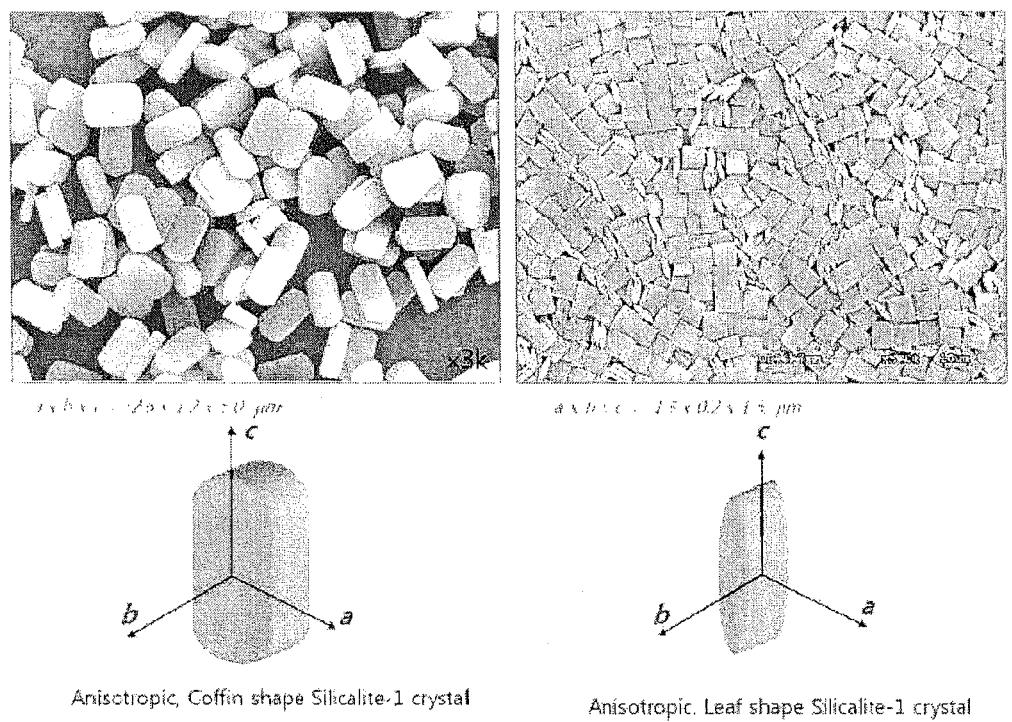
FIG. 2 shows SEM images of anisotropic coffin-shape silicalite-1 crystals and leaf-shape silicalite-1 crystals, and crystal axes thereof.
Figure 3:
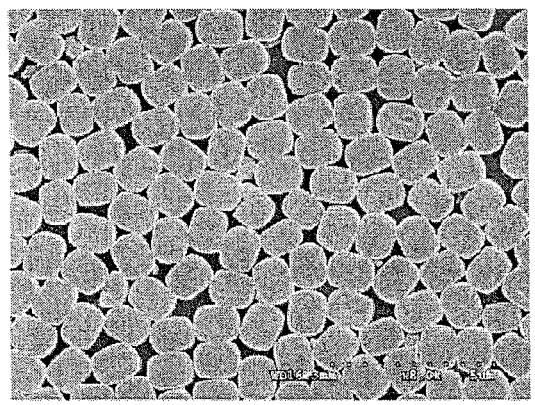
FIG. 3 is an electron micrograph (viewed from top) of a glass plate to which silicalite-1 seed crystals were attached by a rubbing process (Korean Patent No. 0789661), wherein the b-axes of the attached seed crystals are oriented perpendicular to the glass plate, and the a- and b-axes are oriented randomly.
Figure 4:
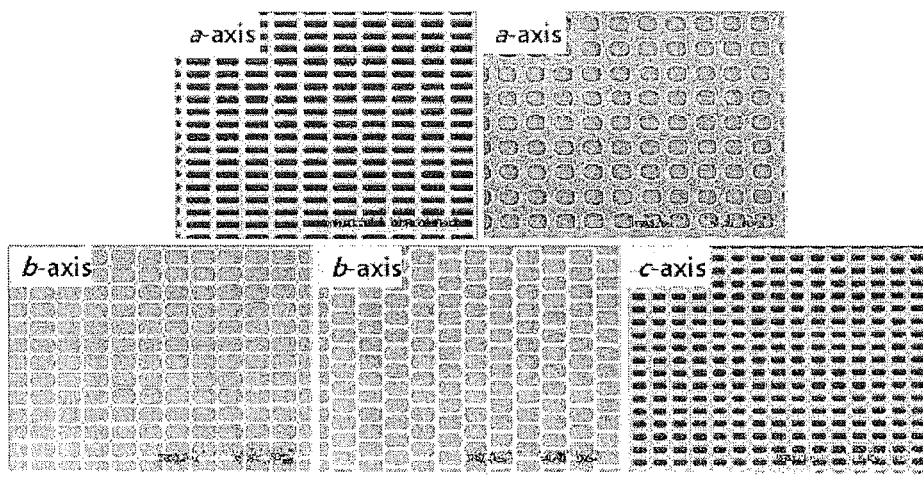
FIG. 4 is SEM photographs of silicon wafers on which micro-pattern depressions were formed using photoresist (PR) such that the crystal axes can all be uniformly oriented on the silicon wafer while each of the a-, b- and c-axes of the seed crystals can be oriented perpendicular to their corresponding wafer surface.

The upper transparent solution was removed, and the remaining solid product was washed with a large amount of DDW and dried at 100° C. for 24 hours to afford coffin-shape silicalite-1 seeds having a size of a×b×c=2.6 um×1.2 um×5.0 um (see FIG. 2).

EXAMPLE 2

Anisotropic Leaf-Shape Silicalite-1 Crystals

Reaction conditions described in the literature (Angew. Chem. Int. Ed., 2006, 45, 1154-1158) were used. 1.696 g of TEOS was added to a PP bottle containing 1.019 g of trimer-$TPA^{3+}$-$3I^-$, 0.295 g of KOH and 34.2 g of DDW to prepare a clear gel. The obtained gel had a molar composition of 8 TEOS/1 (trimer-$TPA^{3+}$-$3I^-$)/5 KOH/1900 $H_2O$. After aging for 24 hours, the gel was filtered through No. 2 Whatman filter paper and transferred into a Teflon-lined high-pressure reactor. The content in the reactor was subjected to hydrothermal reaction at 175° C. for 24 hours. The product was collected, washed with a large amount of DDW and dried at 100° C. for 24 hours to afford leaf-shape silicalite-1 powder (see FIG. 2).

EXAMPLE 2

Preparation of Seed Crystal Monolayer Whose Crystal Axes Had all been Uniformly Oriented on Substrate

EXAMPLE 2-1

Figure 5:
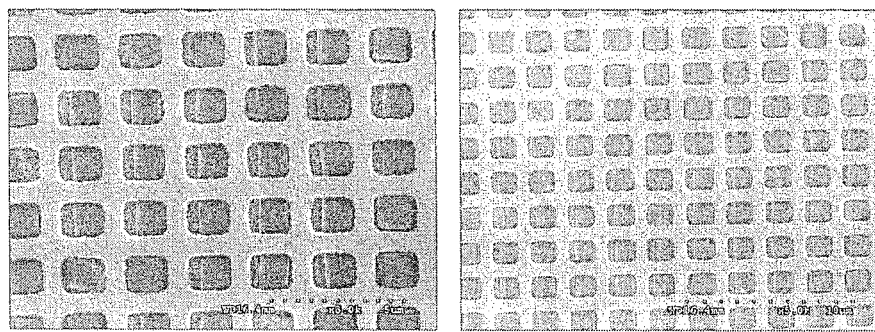
FIG. 5 is a set of SEM images showing leaf-shape silicalite-1 crystals whose crystal axes had all been uniformly oriented on a silicon wafer having micro-pattern depressions formed using photoresist (PR) while the a-axis had been oriented (a-axis orientation) perpendicular to the wafer surface.

Monolayer of Leaf-Shape Silicalite-1 Crystals Whose Crystal Axes Had all been Uniformly Oriented on a Silicon Wafer Having Micro-Pattern Depressions Formed Using Photoresist (PR) while the a-Axis Had been Oriented (a-Axis Orientation) Perpendicular to the Wafer Surface (FIG. 5)

The following process was carried out to obtain the title product:
Step 1: a silicon wafer having micro-pattern depressions was washed with Piranha solution for 2 hours and washed with a large amount of DDW.
Step 2: the silicon wafer was spin-coated with 0.1% PEI solution (in EtOH) at 2000 rpm for 15 seconds.
Step 3: leaf-shape silicalite-1 powder was applied to the wafer by a rubbing process using a PDMS plate.
Step 4: steps 2 and 3 repeated three times.
Step 5: silicalite-1 powder attached randomly on the silicalite-1 powder inserted into the micro-pattern depressions was removed using a 2 mm thick clean PDMS plate.
Step 6: the resulting plate was calcined at 550° C. for 2 hours (heating time: 2 hrs; cooling time: 1 hr).

EXAMPLE 2-2

Figure 6:
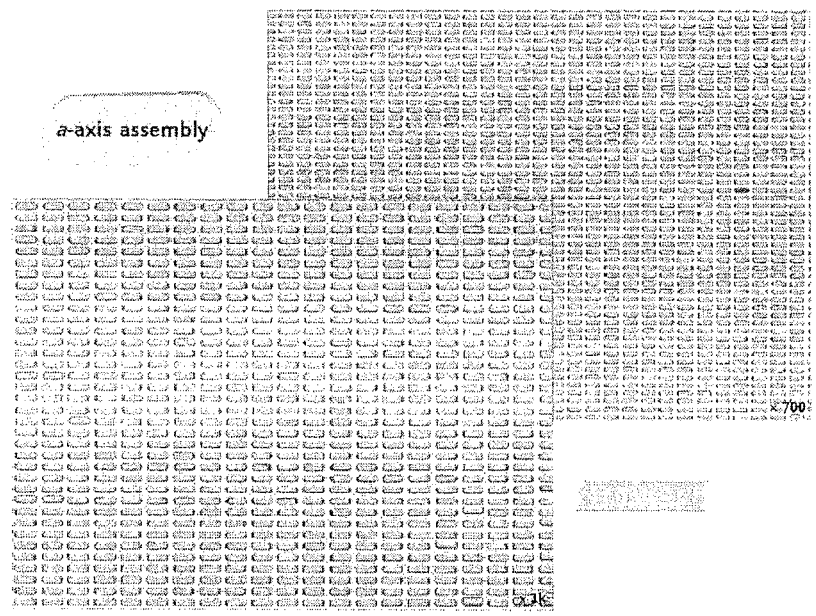
FIGS. 6 to 9 are SEM images showing coffin-shape silicalite-1 crystals whose crystal axes had all been uniformly oriented on a silicon wafer having micro-pattern depressions formed using photoresist (PR) while each of the a-, b- and c-axes had been oriented (a-axis orientation, b-axis orientation, and c-axis orientation) perpendicular to their corresponding wafer surface.

Monolayer of Coffin-Shape Silicalite-1 Crystals Whose Crystal Axes Had all been Uniformly Oriented on a Silicon Wafer Having Micro-Pattern Depressions Formed Using Photoresist (PR) while the a-Axis Had been Oriented (a-Axis Orientation) Perpendicular to the Wafer Surface (FIG. 6)

The following process was carried out to obtain the title compound:

Step 1: a silicon wafer having micro-pattern depressions formed thereon was washed with Piranha solution for 2 hours and washed with a large amount of DDW.
Step 2: the wafer was spin-coated with 0.4% PEI solution (in EtOH) at 2000 rpm for 15 sec.
Step 3: coffin-shape silicalite-1 powder was applied to the wafer by a rubbing process using a latex glove.
Step 4: steps 2 and 3 were repeated three times.
Step 5: the wafer was washed with ethanol, and silicalite-1 powder attached randomly on the silicalite-1 powder inserted into the micro-pattern depressions was removed using a 2-mm thick clean PDMS plate.
Step 6: the wafer was calcined at 550° C. for 3 hours (heating time: 2 hrs; cooling time: 1 hr).

EXAMPLE 2-3

Figure 7:
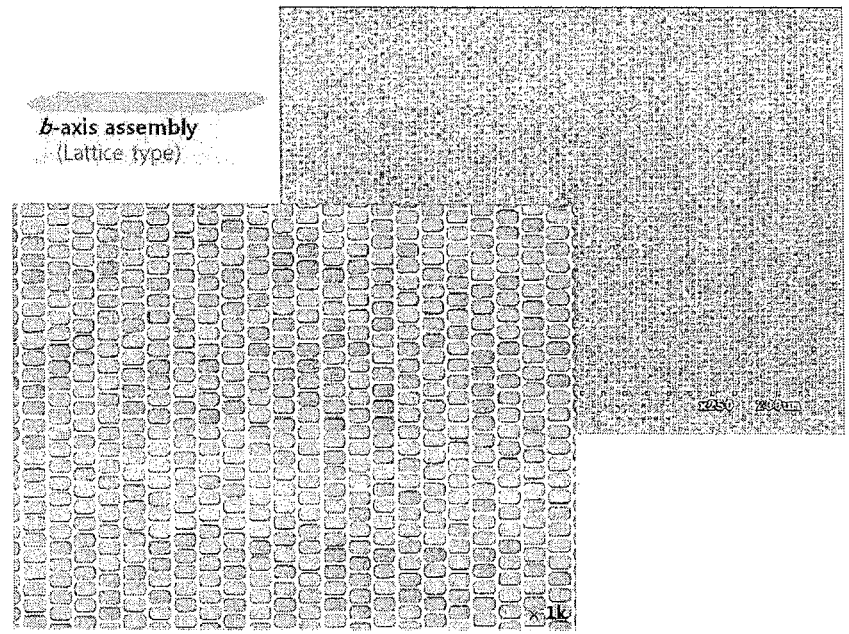
Figure 8:
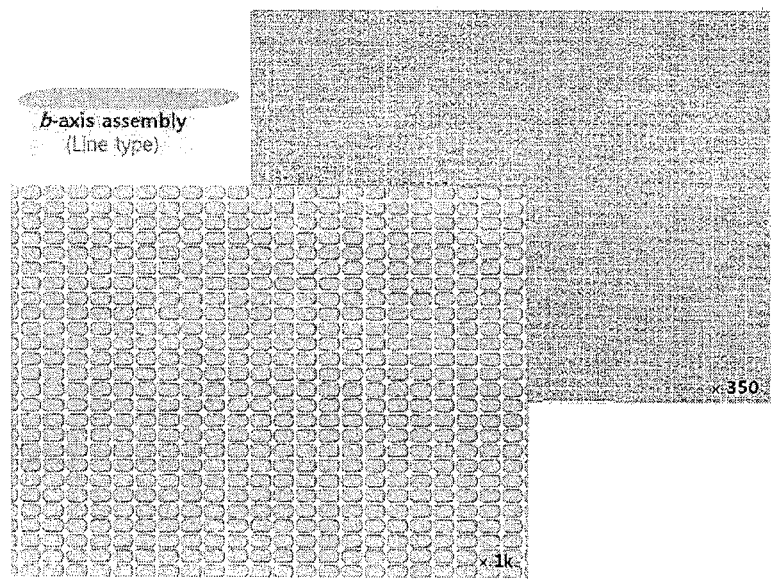

Monolayer of Coffin-Shape Silicalite-1 Crystals Whose Crystal Axes Had all been Uniformly Oriented on a Silicon Wafer Having Micro-Pattern Depressions Formed Using Photoresist (PR) while the b-Axis Had been Oriented (b-Axis Orientation) Perpendicular to the Wafer Surface (Line and Lattice Type Pattern) (FIGS. 7 and 8)

The title product was obtained in the same manner as Example 2-2, except that the shape and arrangement of the micro-pattern depressions were changed, 0.2% PEI solution was used instead of 0.4% PEI solution in step 2, and calcination in step 6 was carried out for 3 hours.

EXAMPLE 2-4

Figure 9:
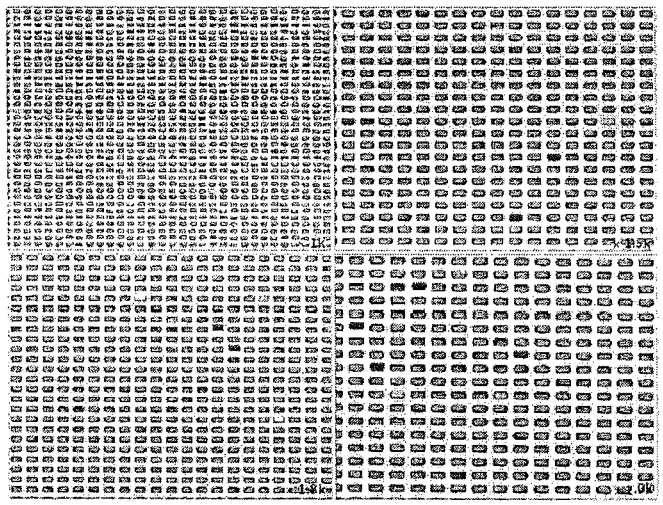

Monolayer of Coffin-Shape Silicalite-1 Crystals Whose Crystal Axes Had all been Uniformly Oriented on a Silicon Wafer Having Micro-Pattern Depressions Formed Using Photoresist (PR) while the c-Axis Had been Oriented (c-Axis Orientation) Perpendicular to the Wafer Surface (FIG. 9)

Figure 10:
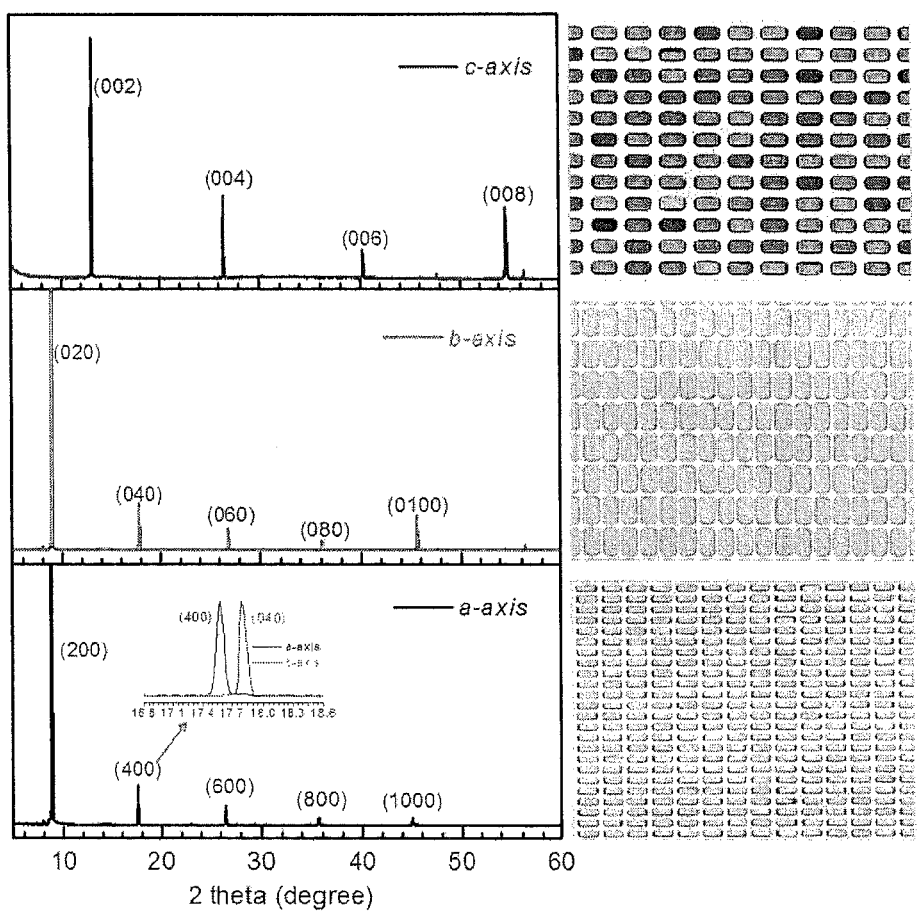
FIG. 10 is an XRD pattern of a line array of coffin-shape silicalite-1 crystals whose crystal axes had all been uniformly oriented on a silicon wafer while each of the c-, b- and a-axes (a-axis orientation, b-axis orientation, and c-axis orientation) had been oriented perpendicular to their corresponding wafer surface.

The title product was obtained in the same manner as Example 2-2, except that the shape of the micro-pattern depressions was changed and a PDMS plate was used instead of the latex glove in step 3.
FIG. 10 shows XRD patterns of the coffin-shape silicalite-1 crystals. As can be seen therein, all the crystal axes of the seed crystals arranged on the silicon wafers according to Examples 2-4, 2-3 and 2-4 were uniformly oriented, and each of the a-, b- and c-axes were oriented perpendicular to their corresponding wafer surface (a-axis orientation, b-axis orientation, and c-axis orientation).

EXAMPLE 3

Transfer and Secondary Growth of Seed Crystals Whose Crystal Axes Had all been Uniformly Oriented

EXAMPLE 3-1

Figure 11:
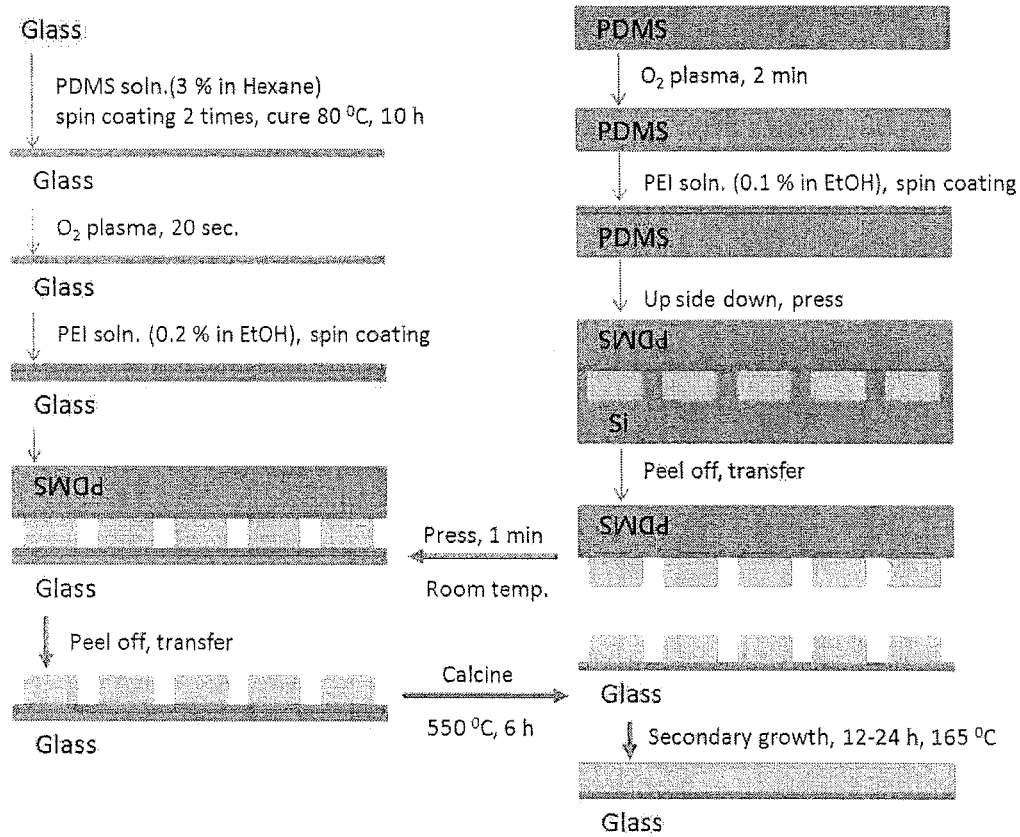
FIG. 11 is a schematic view showing a process which comprises transferring seed crystals, the crystal axes of which have all been oriented under a predetermined rule, to a glass plate, and subjecting the transferred seed crystals to secondary growth.

Transfer and Secondary Growth of Leaf-Shape Silicalite-1 Seed Crystals Whose Crystal Axes Had all been Uniformly Oriented According to the process shown in FIG. 11, the seed crystals whose crystal axes have all been uniformly oriented were transferred to a glass plate and subject to secondary growth, thereby forming a silicalite-1 thin film.

Figure 12:
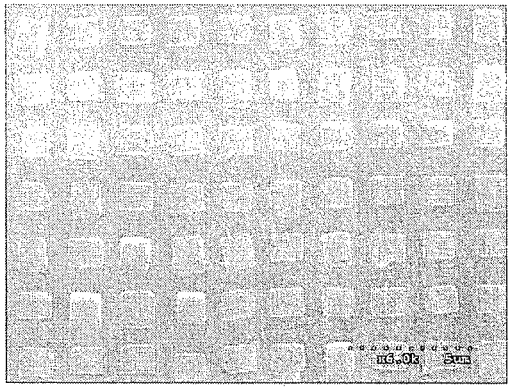
FIG. 12 is a SEM image of the product obtained according to Example 2-1 by forming a monolayer of leaf-shape silicalite-1 seed crystals whose crystal axes had been uniformly oriented on a silicon wafer, transferring the monolayer to a glass plate and calcining the transferred monolayer.

The SEM image of FIG. 12 shows the product obtained by uniformly orienting all the crystal axes of seed crystals on a silicon wafer while orienting the a-axis perpendicular to the substrate surface according to Example 2-1 to thereby form a leaf-shape silicalite-1 seed crystal monolayer, and transferring the monolayer to a glass plate and calcining the transferred monolayer according to the process shown in FIG. 11.

Figure 13:
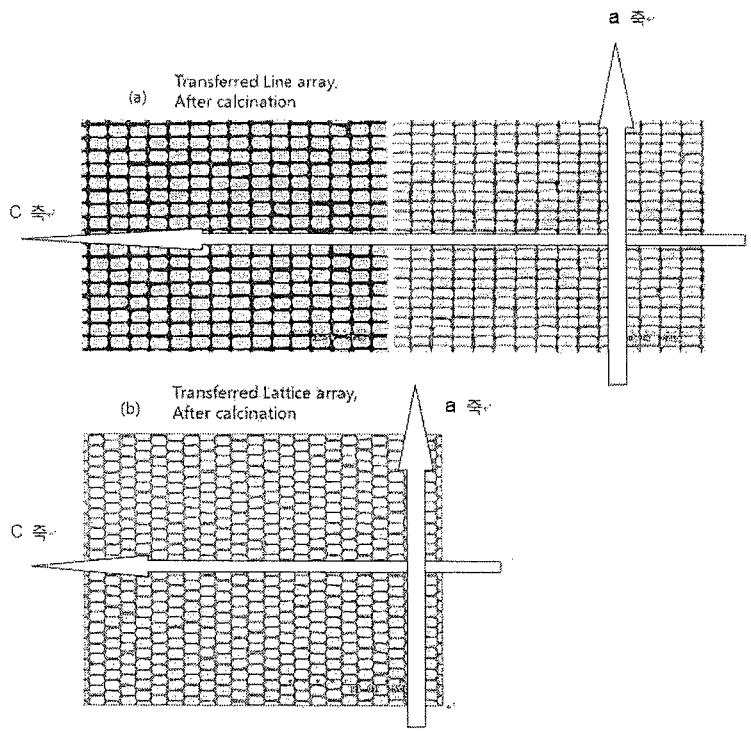
FIG. 13 is a SEM image of the product obtained by transferring to a PEI-coated glass plate, a monolayer of silicalite-1 crystals (the crystal axes of which had all been uniformly oriented and the b-axis had been oriented (b-axis orientation) perpendicular to the wafer surface by the shape micro-pattern depressions formed on a silicon wafer using photoresist (PR)), and calcining the transferred monolayer.

Also, the SEM images of FIG. 13 shows the product obtained by uniformly orienting all the crystal axes of coffin-shape silicalite-1 crystals by micro-pattern depressions, formed on a silicon wafer using PR, while orienting the b-axis perpendicular to the substrate surface, according to Example 2-3, to thereby form a monolayer of Coffin-type silicalite-1 crystals, and transferring the monolayer to a PEI-coated glass plate and calcining the transferred monolayer according to the process shown in FIG. 11.

EXAMPLE 3-2

Figure 14:
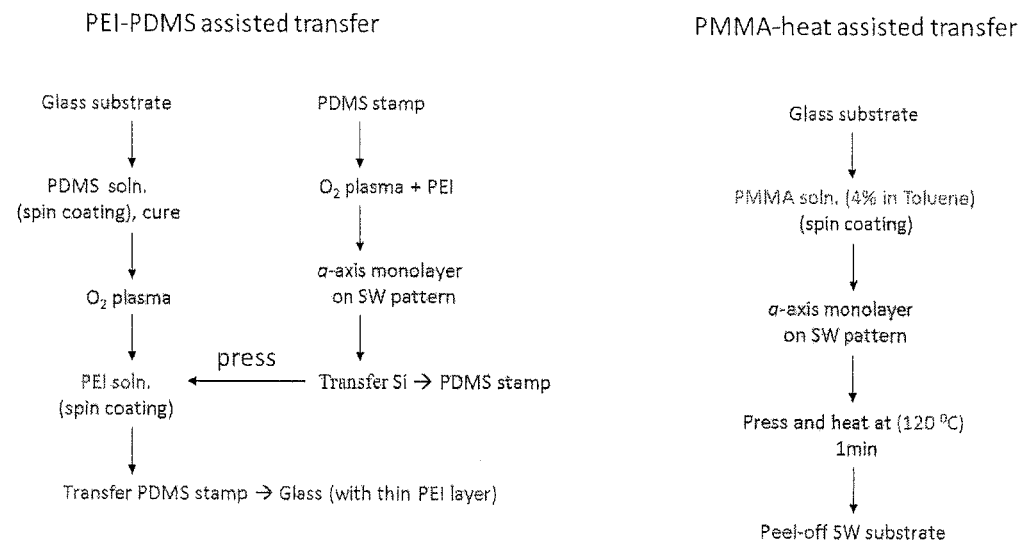
FIG. 14 shows other two processes of transferring seed crystals, the crystal axes of which had all been oriented under a predetermined rule, to a glass plate.

Transfer of Silicalite-1 Seed Crystals Whose Crystal Axes Had all been Uniformly Oriented FIG. 14 shows two other processes in which a monolayer of seed crystals whose crystal axes were all uniformly oriented is transferred to a glass plate (SW: silicon wafer).

Figure 15:
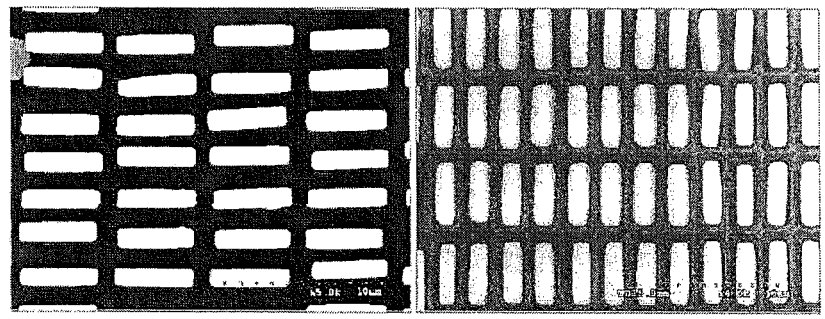
FIG. 15 is a SEM image of the product obtained according to the process of FIG. 14 by transferring a monolayer of silicalite-1 crystals, the crystal axes of which had all been uniformly oriented while the a-axis had been oriented perpendicular to the substrate surface, to a glass plate.

FIG. 15 shows the product obtained by uniformly orienting all the crystal axes of coffin-shape Silicalite-1 seed crystals while orienting the a-axis perpendicular to the substrate surface, to thereby form a monolayer of coffin-shape Silicalite-1 seed crystals, and transferring the monolayer to a glass plate, according to the process shown in FIG. 14.

EXAMPLE 3-3

Secondary Growth of Silicalite-1 Seed Crystals Whose Crystal Axes Had all been Uniformly Oriented The secondary growth of seed crystals was carried out in the following manner.

A gel for the growth of a silicalite-1 thin film was prepared by adding 20.2 g of TEAOH and 22.2 g of DDW to a plastic beaker containing 31.8 g of TEOS. The beaker was covered with a polymer film, and the content in the beaker was stirred with a magnetic bar. Meanwhile, a fluoride source consisting of a mixture containing 2.45 g of $(NH_4)_2SiF_6$, 10.1 g of TEAOH and 11.1 g of DDW was stirred in another beaker. As the TEOS was completely hydrolyzed to form a clear solution, the fluoride source was added to the clear solution with stirring. The mixture solution was stirred by hand for 2 hours or more and aged in a static state for 6 hours. The resulting gel had a composition of 4 TEOS/1.92 TEAOH/0.36 $(NH_4)_2SiF_6$/78.4 $H_2O$. After aging, the semi-solid gel was finely crushed. The crushed gel was transferred into a Teflon-lined high-pressure reactor. The glass plate, the surface of which had the seed crystals whose crystal axes have all been uniformly oriented, was vertically inserted into the gel. The reactor was sealed and placed in an oven preheated to 165° C. After the reaction has been performed for a predetermined time, the reactor was cooled with tap water. The film was removed from the reactor and washed clean with tap water. The film was treated ultrasonically for 1 minute, cleaned with DDW and dried with $N_2$ gas.

Figure 16:
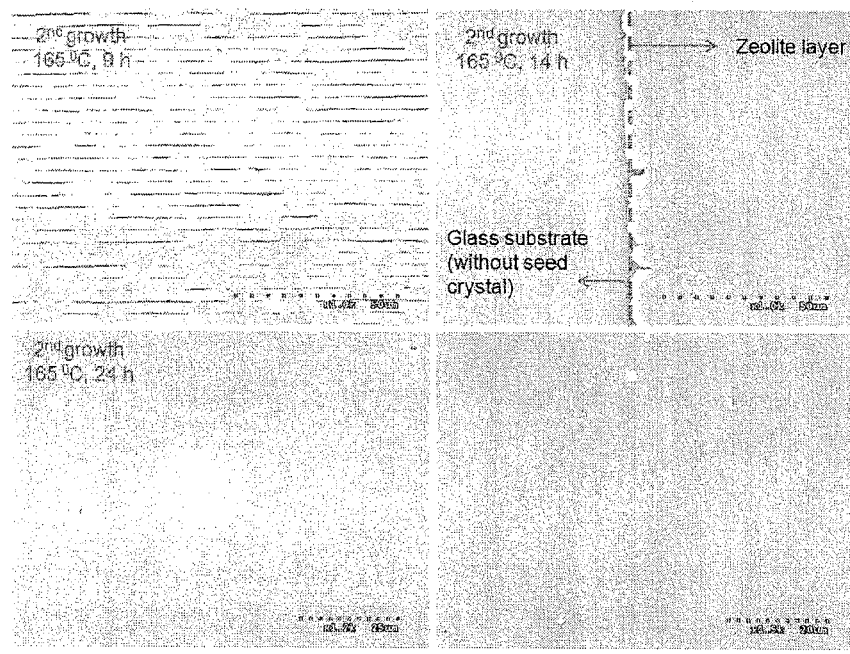
FIG. 16 shows SEM images of silicalite-1 thin films formed with the passage of reaction time by secondary growth of the monolayer of the coffin-shape silicalite-1 seed crystals, the crystal axes of which had all been uniformly oriented while the b-axis had been oriented perpendicular to the substrate surface and the a- and c-axes had been oriented parallel to the substrate surface.

FIG. 16 shows SEM images of silicalite-1 thin films formed with the passage of reaction time by secondary growth of the monolayer of the coffin-shape silicalite-1 seed crystals, the crystal axes of which had all been uniformly oriented while the b-axis had been oriented perpendicular to the substrate surface and the a- and c-axes had been oriented parallel to the substrate surface.

As can be seen in the upper right panel of FIG. 16 (secondary growth for 14 hours), no crystal nucleation occurred in the glass plate portion having no silicalite-1 seed crystals, suggesting that no crystal nucleation occurred on the seed crystal surface.

Figure 17:
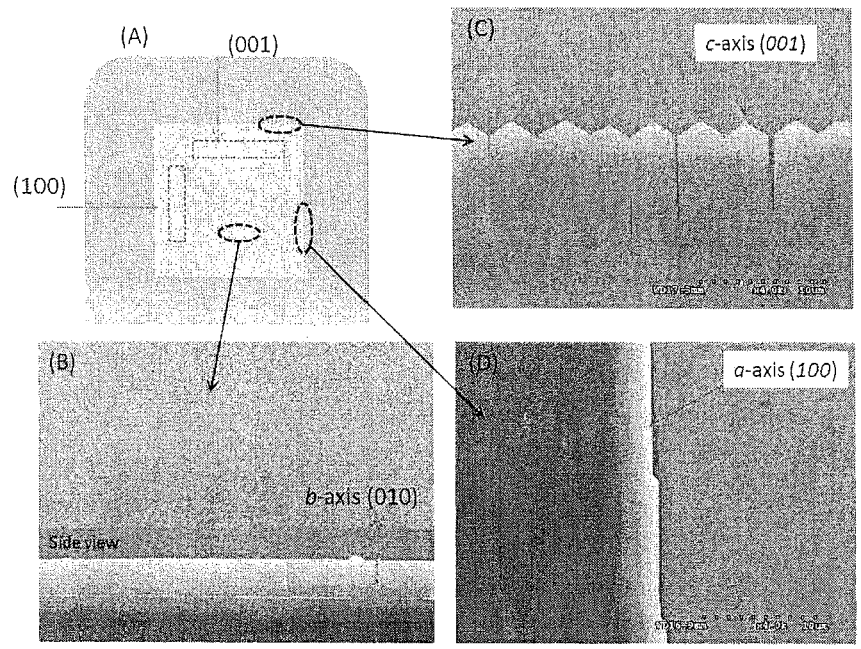
FIG. 17 is a SEM image of the silicalite-1 thin film obtained after secondary growth for 24 hours, among the films of FIG. 16.

FIG. 17 shows an SEM image of the silicalite-1 thin film obtained after secondary growth for 24 hours, among the films of FIG. 16. In FIG. 17(A), the crystal directions of the 3D silicalite-1 film (1 cm×1 cm; light green portion) formed on the silicon wafer (gray portion) are indicated by the arrow. FIGS. 17(B) to 17(D) are SEM images the crystal directions at the boundary of the 3D film, which correspond to the arrow directions in FIG. 17(A). FIG. 17(B) shows a side view of the film according to the b-axis.

Figure 18:
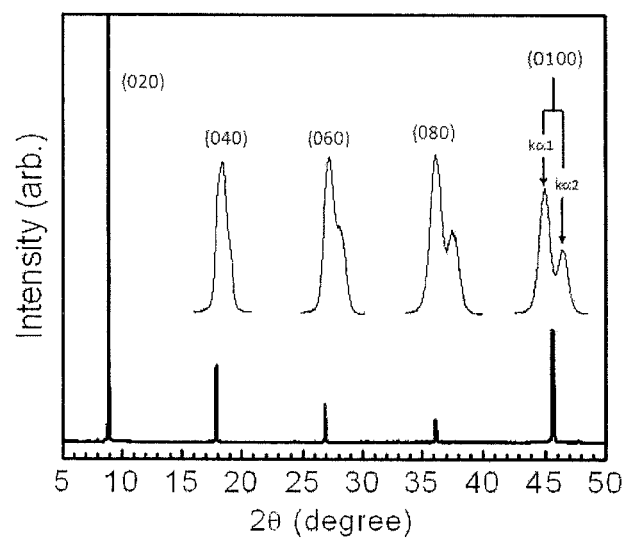
FIG. 18 is an XRD pattern of the silicalite-1 thin film obtained after secondary growth for 24 hours, among the films of FIG. 16.

As can be seen in FIG. 17, the a-axis, b-axis and c-axis were uniformly oriented over the formed silicalite-1 thin film, and these crystal axis orientations were consistent with those of the seed crystals. This could be confirmed from the XRD pattern of the silicalite-1 thin film obtained after secondary growth for 24 hours, as shown in FIG. 18.

Figure 19:
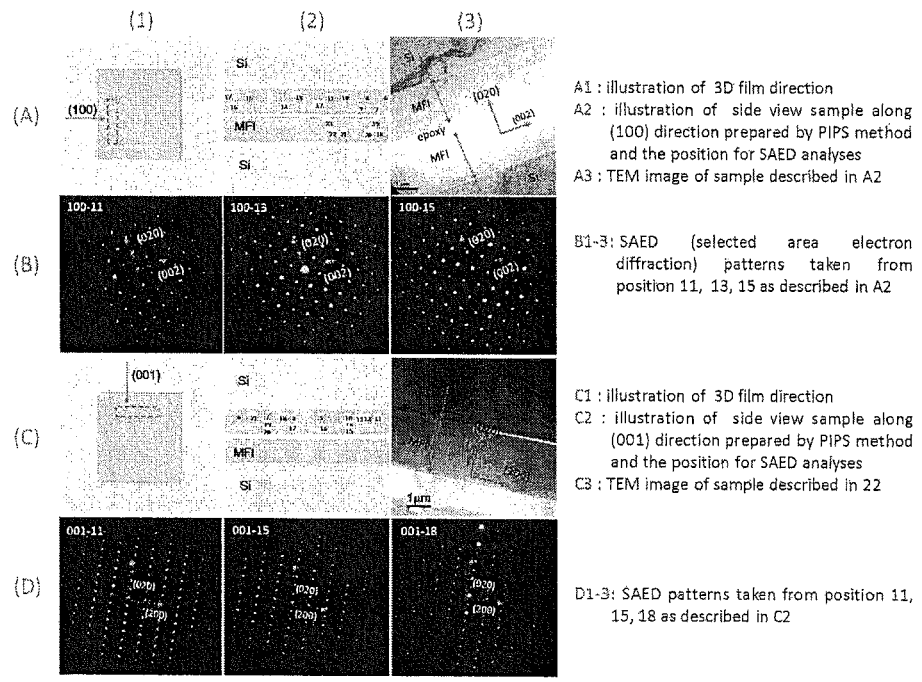
FIG. 19 is TEM images and SAED (selected area electron diffraction) patterns of the silicalite-1 thin film obtained after second growth for 24 hours, among the films of FIG. 16.

FIG. 19 shows TEM image and SAED (selected area electron diffraction) pattern of the silicalite-1 thin film obtained after second growth for 24 hours, among the films of FIG. 16. As can be seen in FIG. 19, the formed silicalite-1 thin film showed a regular SAED pattern, suggesting that the formed silicalite-1 thin film was formed of large single crystals whose a-, b- and c-axes were uniformly oriented over the film.

Figure 20:
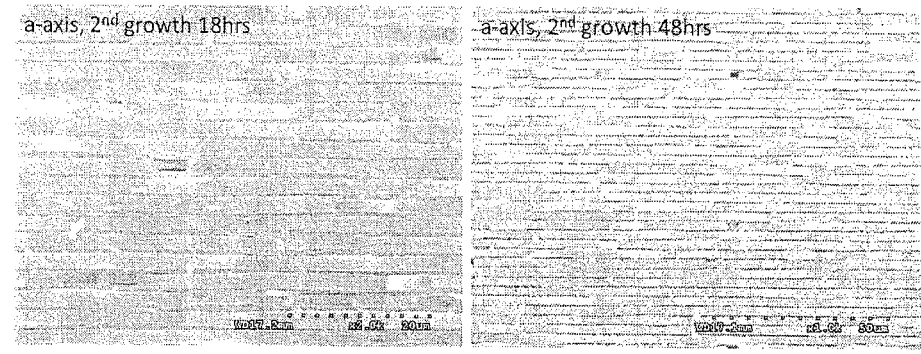
FIG. 20 shows SEM images of silicalite-1 thin films formed with the passage of reaction time by secondary growth of the monolayer of the coffin-shape silicalite-1 seed crystals, the crystal axes of which had all been uniformly oriented while the a-axis had been oriented perpendicular to the substrate surface and the b- and c-axes had been oriented parallel to the substrate surface.

FIG. 20 shows silicalite-1 thin films formed with the passage of reaction time by secondary growth of the monolayer of the coffin-shape silicalite-1 seed crystals, the crystal axes of which had all been uniformly oriented while the a-axis had been oriented perpendicular to the substrate surface and the b- and c-axes had been oriented parallel to the substrate surface.

Figure 21:
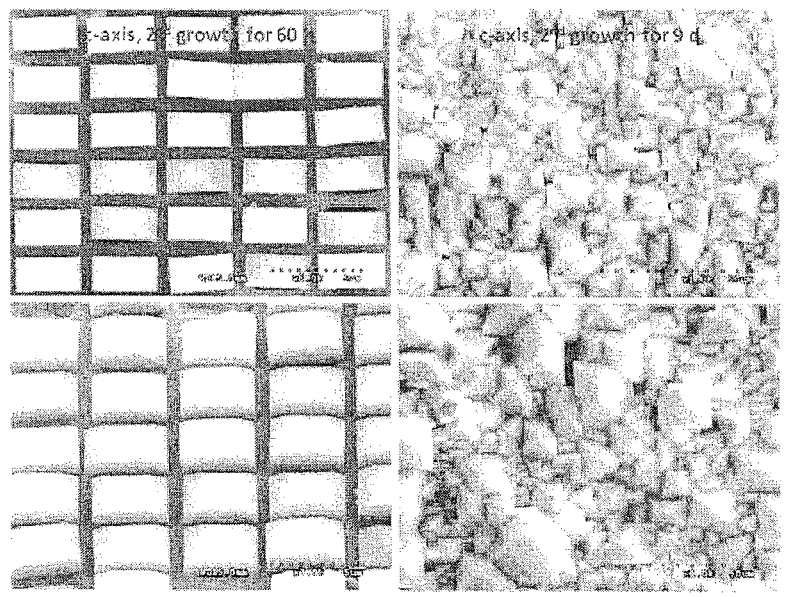
FIG. 21 shows SEM images of silicalite-1 thin films formed with the passage of reaction time by secondary growth of the monolayer of the coffin-shape silicalite-1 seed crystals, the crystal axes of which had all been uniformly oriented while the c-axis had been oriented perpendicular to the substrate surface and the a- and b-axes had been oriented parallel to the substrate surface.
Figure 22:
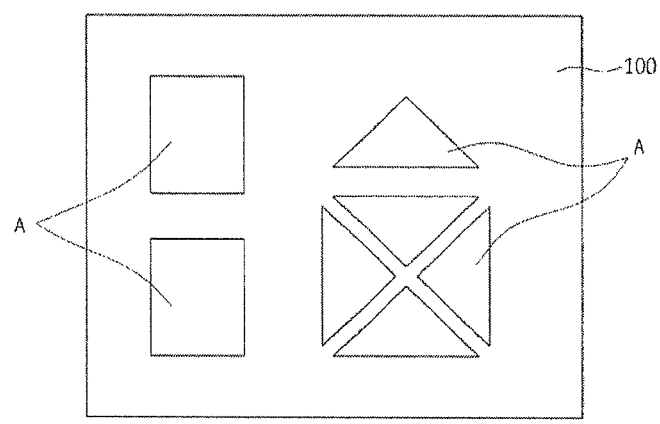
FIG. 22 is a schematic view showing a specific pattern or shape "A" formed by the collection of seed crystals inserted into pores on a substrate or a template.

FIG. 21 shows silicalite-1 thin films formed with the passage of reaction time by secondary growth of the monolayer of the coffin-shape silicalite-1 seed crystals, the crystal axes of which had all been uniformly oriented while the c-axis had been oriented perpendicular to the substrate surface and the a- and b-axes had been oriented parallel to the substrate surface.

As can be seen in FIGS. 20 and 21, when all the crystal axes of the seed crystals disposed on the substrate were uniformly oriented, all the crystal axes of the silicalite-1 thin film framed from the seed crystals were also uniformly oriented over the film, regardless of the crystal axis oriented perpendicular to the substrate surface was the a-axis, the b-axis or the c-axis.

Although the present disclosure has been described in detail with reference to the specific features, it will be apparent to those skilled in the art that this description is only for a preferred embodiment, and does not limit the scope of the present disclosure. Thus, the substantial scope of the present disclosure will be defined by the appended claims and equivalents thereof.

The invention claimed is:

1. A method for preparing a thin or thick film, comprising the steps of:
   (1) arranging non-spherical seed crystals on a substrate such that all the a-, b- and c-axes of each seed crystal are oriented under a predetermined rule; and
   (2) forming and growing the film from the seed crystals through secondary growth by exposing the arranged seed crystals of step (1) to a seed crystal growth solution containing a structure-directing agent, which induces only secondary growth from the surface of the seed crystals without inducing crystal nucleation in the crystal growth solution or on the seed crystal surface, wherein in step (1), the seed crystals have all the a-, b- and c-axes thereof oriented uniformly on the substrate, such that all the a-axes of the seed crystals are parallel to each other, all the b-axes of the seed crystals are parallel to each other, and all the c-axes of the seed crystals are parallel to each other, wherein in step (2), the seed crystals are two-dimensionally connected to each other and three-dimensionally grow perpendicular to the substrate surface by secondary growth from the seed crystal surface, to thereby form the film.

2. The method of claim 1, wherein the seed crystal growth solution used in step (2) contains a structure-directing agent.

3. The method of claim 1, wherein the seed crystals arranged on the substrate in step (1) have all the a-, b- and c-axes thereof oriented uniformly on the substrate and form a monolayer.

4. The method of claim 1, wherein the seed crystals are ordered porous materials.

5. The method of claim 1, wherein, in step 2, secondary growth from the surface of the seed crystals in a region in which orientations of the crystal axes of the adjacent crystal seeds are uniform results in the following:

forming a single crystal larger than the largest diameter of the seed crystals parallel to the substrate surface through two-dimensional connection between the seed crystals; or forming a single crystal larger than the largest diameter of the seed crystals perpendicular to the substrate surface through the growth of the seed crystals perpendicular to the substrate surface; or both.

6. The method of claim 5, wherein the film formed through the secondary growth from the surface of the seed crystals in the region in which orientations of the crystal axes of the adjacent crystal seeds are uniform, satisfies the following:

channels extend continuously in an axial direction parallel to the substrate surface;

channels extend continuously in an axial direction perpendicular or oblique to the substrate surface; or both.

7. The method of claim 1, wherein in step (1), the seed crystals have all the a-, b- and c-axes thereof oriented uniformly on the substrate, such that all the a-axes of the seed crystals are parallel to each other, all the b-axes of the seed crystals are parallel to each other, and all the c-axes of the seed crystals are parallel to each other.

8. The method of claim 1, wherein the seed crystals and the formed film are composed of zeolite or zeotype molecular sieve.

9. The method of claim 8, wherein the zeolite or the zeotype molecular sieve has an MFI structure.

10. The method of claim 1, wherein the seed crystals, the a-, b- and c-axes of which have all been oriented uniformly on the substrate in step (1), is formed by a process comprising the steps of:

(A) preparing a substrate, the surface of which has depressions or projections capable of fixing the position and orientation of seed crystal; and (B) placing seed crystals on the substrate, and then applying physical pressure to the seed crystals to insert a portion or the whole of each seed crystal into each of pores defined by the depressions or the projections.

11. The method of claim 10, wherein the physical pressure is applied by rubbing or pressing against the substrate or the template.

12. The method of claim 10, wherein the shape of the pore corresponds to the shape of a portion or the whole of each seed crystal which is inserted into the pore in order to control the orientations of the seed crystals.

13. The method of claim 1, wherein the seed crystals, the a-, b- and c-axes of which have all been oriented uniformly on the substrate in step (1), is formed by a process comprising the steps of:

(A) preparing a template, the surface of which has depressions or projections capable of fixing the position and orientation of seed crystal; and (B) placing seed crystals on the template, and then applying physical pressure to the seed crystals to insert a portion or the whole of each seed crystal into each of pores defined by the depressions or the projections thereby to arrange the seed crystals on the template; and (C) bringing the template having the seed crystals arranged thereon into contact with a substrate to transfer the seed crystals onto the substrate.

14. The method of claim 13, wherein the physical pressure is applied by rubbing or pressing against the substrate or the template.

15. The method of claim 13, wherein the shape of the pore corresponds to the shape of a portion or the whole of each seed crystal which is inserted into the pore in order to control the orientations of the seed crystals.

\* \* \* \* \*